(12) United States Patent
Ueda

(10) Patent No.: US 10,129,998 B2
(45) Date of Patent: Nov. 13, 2018

(54) ELECTRONIC DEVICE

(71) Applicant: OMRON Corporation, Kyoto-shi, Kyoto (JP)

(72) Inventor: Hiroaki Ueda, Otsu (JP)

(73) Assignee: OMRON Corporation, Kyoto-shi (JP)

( * ) Notice: Subject to any disclaimer, the term of this patent is extended or adjusted under 35 U.S.C. 154(b) by 0 days.

(21) Appl. No.: 15/681,517

(22) Filed: Aug. 21, 2017

(65) Prior Publication Data

US 2018/0098453 A1   Apr. 5, 2018

(30) Foreign Application Priority Data

Sep. 30, 2016   (JP) .................................. 2016-194280

(51) Int. Cl.
| | |
|---|---|
| *H05K 7/14* | (2006.01) |
| *H01R 13/514* | (2006.01) |
| *H01R 9/26* | (2006.01) |
| *H01R 13/24* | (2006.01) |

(52) U.S. Cl.
CPC ....... *H05K 7/1474* (2013.01); *H01R 13/2492* (2013.01); *H01R 13/514* (2013.01); *H05K 7/1465* (2013.01); *H05K 7/1467* (2013.01); *H05K 7/1468* (2013.01); *H01R 9/2675* (2013.01); *H01R 13/2442* (2013.01)

(58) Field of Classification Search
CPC .. H05K 7/1474; H05K 7/1467; H05K 7/1465; H05K 7/1468; H01R 13/514; H01R 13/2492; H01R 9/2675; H01R 13/2442
USPC .......................................... 361/748, 790, 784
See application file for complete search history.

(56) References Cited

U.S. PATENT DOCUMENTS

| | | | | |
|---|---|---|---|---|
| 5,418,688 | A * | 5/1995 | Hertz ................... | G06K 19/077 174/260 |
| 5,812,387 | A * | 9/1998 | Lu .......................... | H02M 3/00 361/790 |
| 5,933,343 | A * | 8/1999 | Lu .......................... | H02M 3/00 361/790 |
| 6,317,330 | B1 * | 11/2001 | Portman ................ | H05K 7/142 257/723 |
| 6,624,432 | B1 * | 9/2003 | Gabower ............. | H04B 1/3838 174/384 |
| 7,365,992 | B2 * | 4/2008 | Lee ........................ | H01L 23/552 174/350 |
| 9,867,297 | B2 * | 1/2018 | Suzuki ................. | H05K 7/2039 |

(Continued)

FOREIGN PATENT DOCUMENTS

JP   2016-129179 A   7/2016

*Primary Examiner* — Dimary Lopez Cruz
*Assistant Examiner* — Abhishek Rathod
(74) *Attorney, Agent, or Firm* — Metrolexis Law Group, PLLC

(57) ABSTRACT

An electronic device includes a first circuit board and a second circuit board arranged to have their first main surfaces facing each other, and a casing containing the first and second circuit boards. The first circuit board has the first main surface having a first electronic component with a mounting height from the first main surface toward the second circuit board greater than a distance between the first and second circuit boards. The second circuit board has an opening or a cutout as a first hollow portion facing the first electronic component. The first hollow portion receives a part of the first electronic component.

8 Claims, 6 Drawing Sheets

(56) References Cited

U.S. PATENT DOCUMENTS

| | | | |
|---|---|---|---|
| 2006/0288139 A1* | 12/2006 | Lee .......................... | G06F 1/16 |
| | | | 710/62 |
| 2008/0165517 A1* | 7/2008 | Wang ..................... | H05K 1/144 |
| | | | 361/800 |
| 2009/0141450 A1* | 6/2009 | Sakata ................. | H05K 7/2099 |
| | | | 361/697 |
| 2009/0284937 A1* | 11/2009 | Rytky .................... | H05K 1/144 |
| | | | 361/749 |
| 2016/0205801 A1 | 7/2016 | Miura et al. | |

* cited by examiner

ELECTRONIC DEVICE

CROSS REFERENCE TO RELATED APPLICATIONS

This application claims priority from prior Japanese Patent Application No. 2016-194280 filed with the Japan Patent Office on Sep. 30, 2016, the entire contents of which are incorporated herein by reference.

FIELD

The disclosure relates to an electronic device, and particularly to an electronic device that serves as a unit of a building block electronic device system, or for example a remote terminal device for a programmable logic controller (PLC) (hereafter simply, a remote terminal device).

BACKGROUND

A variety of electronic device systems each including multiple electronic devices serving as units have been available. One known example is an electronic device system including multiple electronic devices that are arranged side by side in a predetermined direction and assembled together to achieve electrical connection between them. A typical example of this electronic device system is a remote terminal device for a PLC.

A remote terminal device includes a single communication unit and one or more input-output (I/O) units, which are communicable with the communication unit through corresponding serial bus lines and unidirectional communication lines. The communication unit and the I/O units are typically designed as building blocks that are to be joined together.

The remote terminal device with the above structure is described in detail in, for example, Japanese Unexamined Patent Application Publication No. 2016-129179 (Patent Literature 1).

CITATION LIST

Patent Literature

Patent Literature 1: Japanese Unexamined Patent Application Publication No. 2016-129179

SUMMARY

Technical Problem

The remote terminal device with the structure described in Patent Literature 1 can use various techniques to increase its product lineup and also to provide units with different specifications using fewer parts. One such technique is standardization of parts.

When, for example, units are joined to one another in a width direction, which is a lateral direction, a casing is preliminarily divided into a left cover, which mainly constitutes a left side surface of the casing, and a right cover, which mainly constitutes a right side surface of the casing. Middle covers, which are insertable between the left cover and the right cover, are also prepared. An intended number of middle covers in accordance with the specifications are then placed between the left cover and the right cover to define units with different widths using standardized parts. In another example, an intended number of covers each having the same shape as the left cover and the right cover may be inserted between the left cover and the right cover, instead of the middle covers.

In the casing with the above structure, for example, multiple circuit boards may be arranged to face one another in the width direction. When electronic components have low enough heights and are mountable on the facing circuit boards, such electronic components do not touch one another, and the resultant unit can have a small width as designed.

However, a relatively tall electronic component, such as a relay or a transformer, mounted on a circuit board may touch an electronic component mounted on another circuit board, or the other circuit board. The resultant unit may not have the designed width, and may be changed to be wider than intended.

This issue is common not only to the above electronic devices used as the units of the building block electronic device system, but also to an electronic device including multiple circuit boards arranged to face one another in a casing. This can obstruct the trend toward reducing the size of electronic devices.

In response to the above issue, one or more aspects are directed to a technique for preventing an electronic device including multiple circuit boards arranged to face one another in a casing from being upsized for a relatively tall electronic component to be mounted on a circuit board.

Solution to Problem

An electronic device according to one or more aspects includes a first circuit board, a second circuit board, and a casing. The first circuit board and the second circuit board each have a front surface and a back surface as a first main surface and a second main surface. The first circuit board and the second circuit board are arranged at a distance from each other with the first main surfaces of the first and second circuit boards facing each other. The casing contains the first circuit board and the second circuit board.

In the electronic device according to a first aspect, the first circuit board has the first main surface that allows a first electronic component having a mounting height from the first main surface of the first circuit board toward the second circuit board being greater than the distance between the first circuit board and the second circuit board. The second circuit board has an opening or a cutout as a first hollow portion at a position facing the first electronic component, and the first hollow portion receives a part of the first electronic component.

In the electronic device according to a first aspect, the casing may include a first casing containing and retaining the first circuit board, and a second casing containing and retaining the second circuit board. The first casing and the second casing may be arranged side by side in a direction in which the first circuit board and the second circuit board face each other and are fitted together.

In the electronic device according to a first aspect, the first casing and the second casing may be box-shaped. The first casing may have a first opening at a position facing the second casing. The second casing may have a second opening at a position facing the first casing. The first electronic component may be placed through the first opening and the second opening.

In the electronic device according to a first aspect, each of the first casing and the second casing may include a pair of covers that are arranged in the facing direction and are fitted together.

In the electronic device according to a first aspect, the first electronic component may be a relay or a transformer.

In the electronic device according to a second aspect, the first circuit board has the first main surface that allows mounting of a first electronic component having a mounting height from the first main surface of the first circuit board toward the second circuit board being greater than the distance between the first circuit board and the second circuit board, and the second circuit board has the first main surface that allows mounting of a second electronic component having a mounting height from the first main surface of the second circuit board toward the first circuit board being greater than the distance between the first circuit board and the second circuit board. The second circuit board has an opening or a cutout as a first hollow portion at a position facing the first electronic component, and the first hollow portion receives a part of the first electronic component. The first circuit board has an opening or a cutout as a second hollow portion at a position facing the second electronic component, and the second hollow portion receives a part of the second electronic component.

In the electronic device according to a second aspect, the casing may include a first casing containing and retaining the first circuit board, and a second casing containing and retaining the second circuit board. The first casing and the second casing may be arranged side by side in a direction in which the first circuit board and the second circuit board face each other and be fitted together.

In the electronic device according to a second aspect, the first casing and the second casing may be box-shaped. The first casing may have a first opening at a position facing the second casing. The second casing may have a second opening at a position facing the first casing. The first electronic component and the second electronic component may be placed through the first opening and the second opening.

In the electronic device according to a second aspect, each of the first casing and the second casing may include a pair of covers that are arranged in the facing direction and are fitted together.

In the electronic device according to another aspect, each of the first electronic component and the second electronic component may be a relay or a transformer.

Advantageous Effects

Embodiments may prevent an electronic device including multiple circuit boards arranged to face one another in a casing from being upsized for a relatively tall electronic component to be mounted on the circuit board.

DETAILED DESCRIPTION

Figure 1:
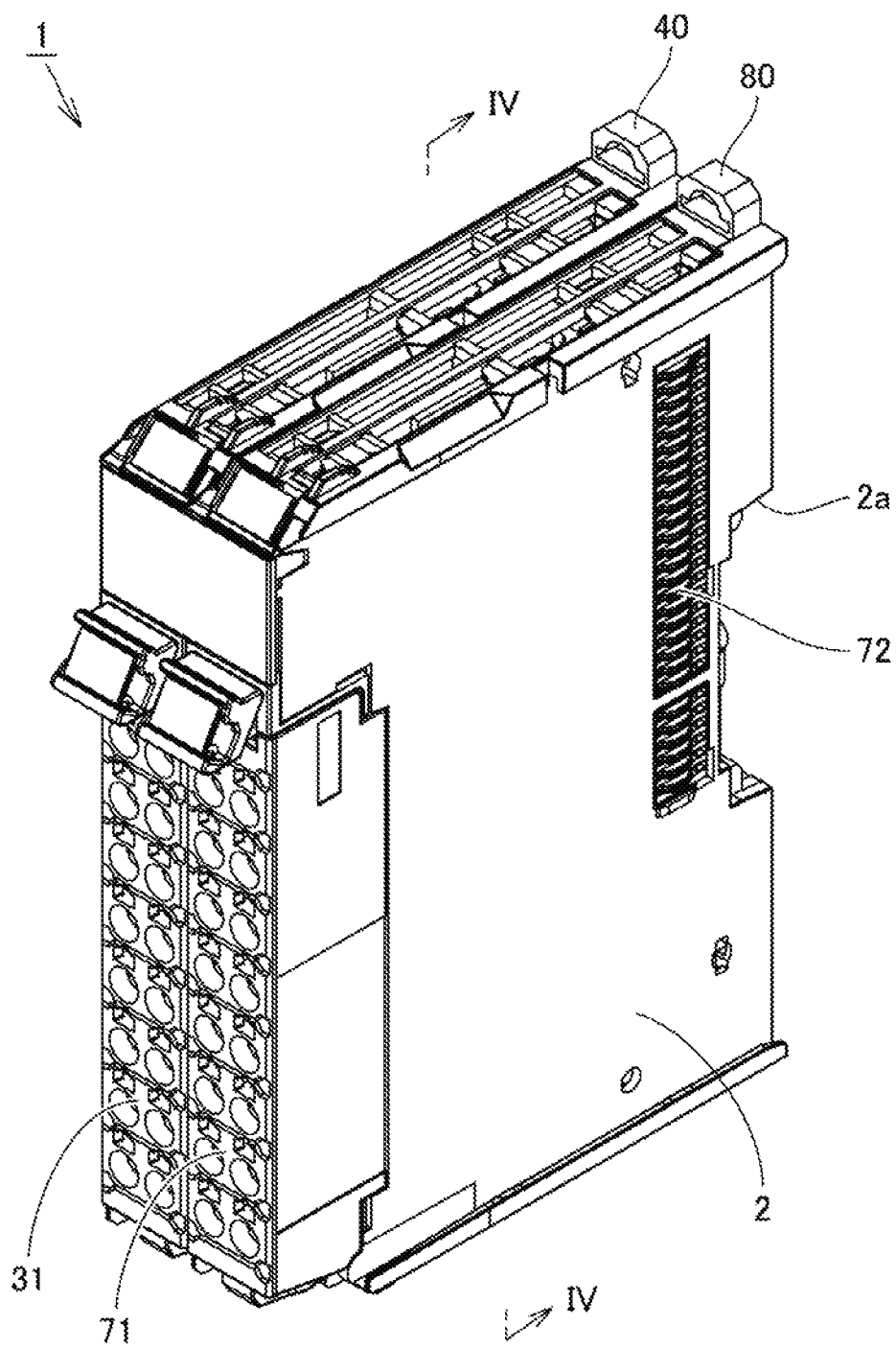
FIG. 1 is a perspective view of an I/O unit in an embodiment.

Embodiments will now be described with reference to the drawings. Although an aspect is embodied as an input-output (I/O) unit in a remote terminal device for a programmable logic controller (PLC) as an example of an electronic device in the embodiments described below, the electronic device may be any other electronic device. In the embodiments described below, the same or corresponding components in the figures are given the same reference numerals, and will not be described redundantly.

Figure 2:
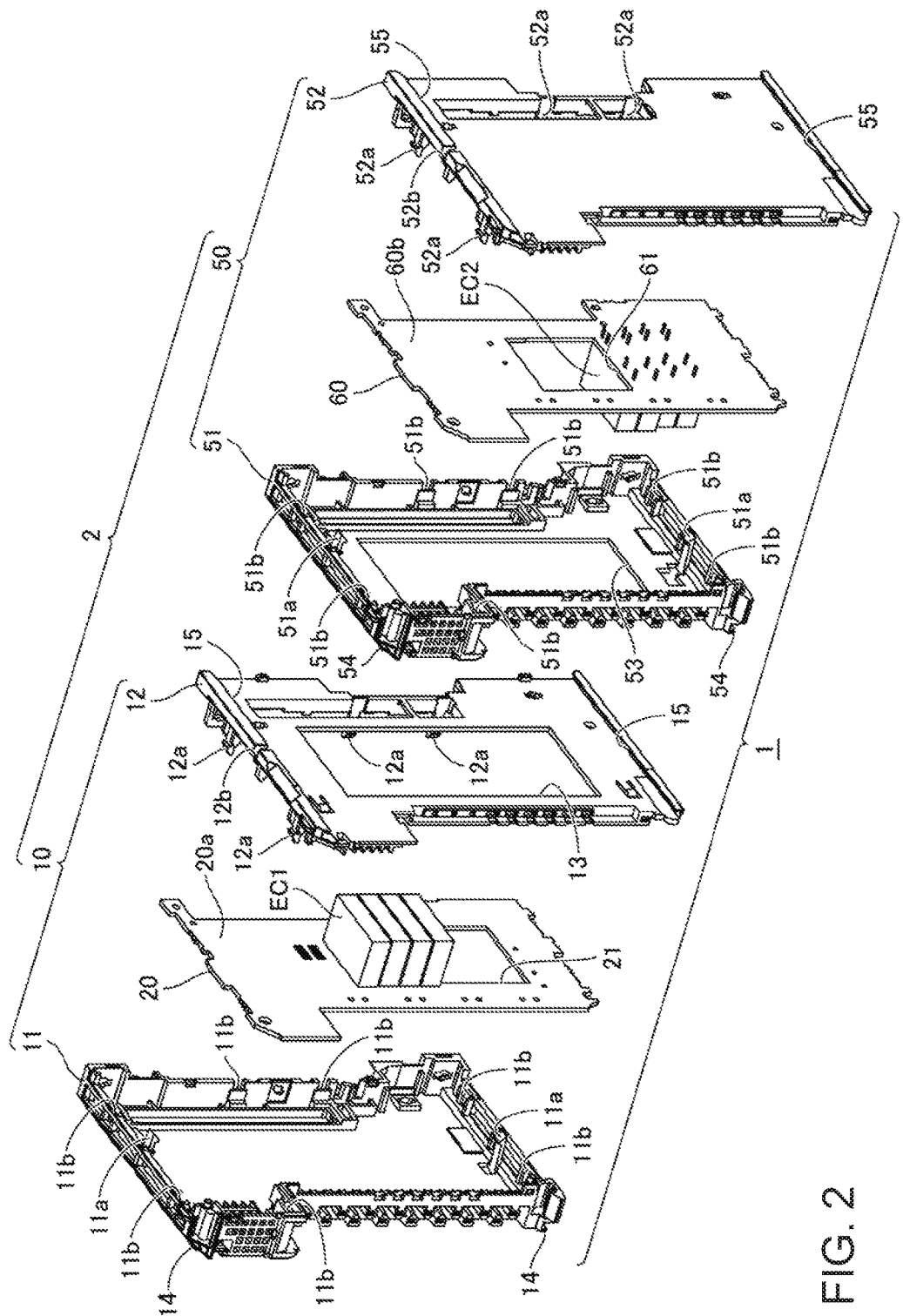
FIG. 2 is a schematic exploded perspective front view of an I/O unit, such as in FIG. 1, viewed from right above.
Figure 3:
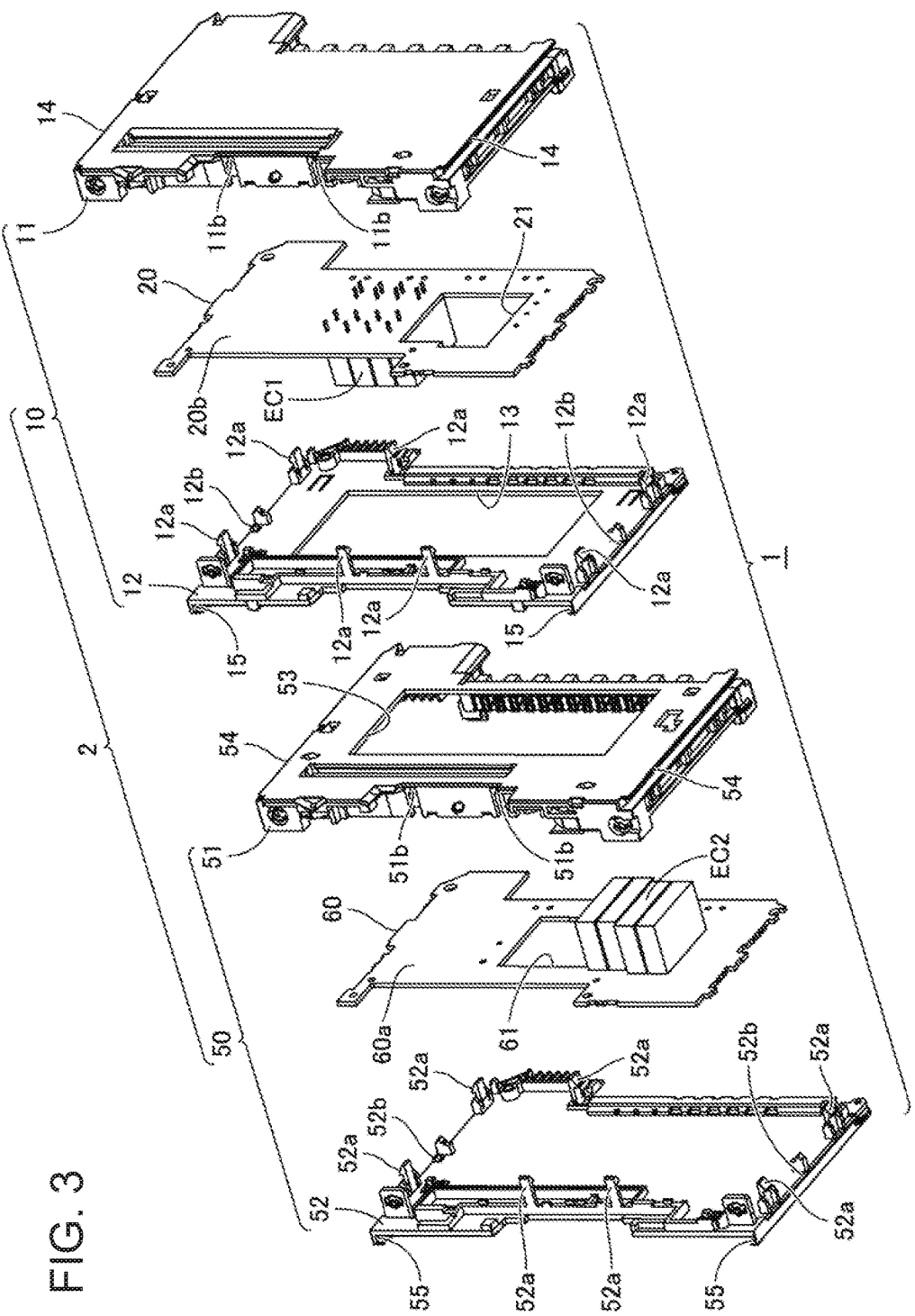
FIG. 3 is a schematic exploded perspective back view of an I/O unit, such as in FIG. 1, viewed from left below.
Figure 4:
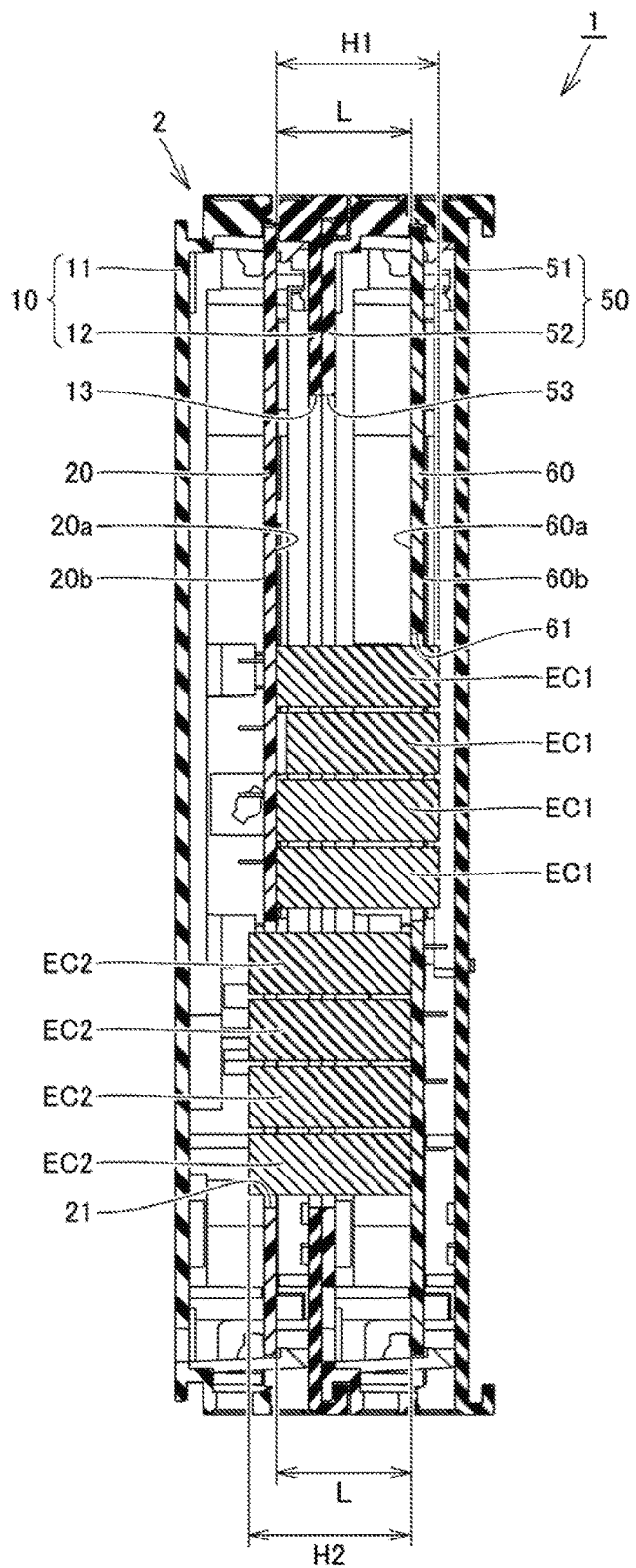
FIG. 4 is a schematic sectional view of the I/O unit shown in FIG. 1 taken along line IV-IV in FIG. 1.
Figure 5A:
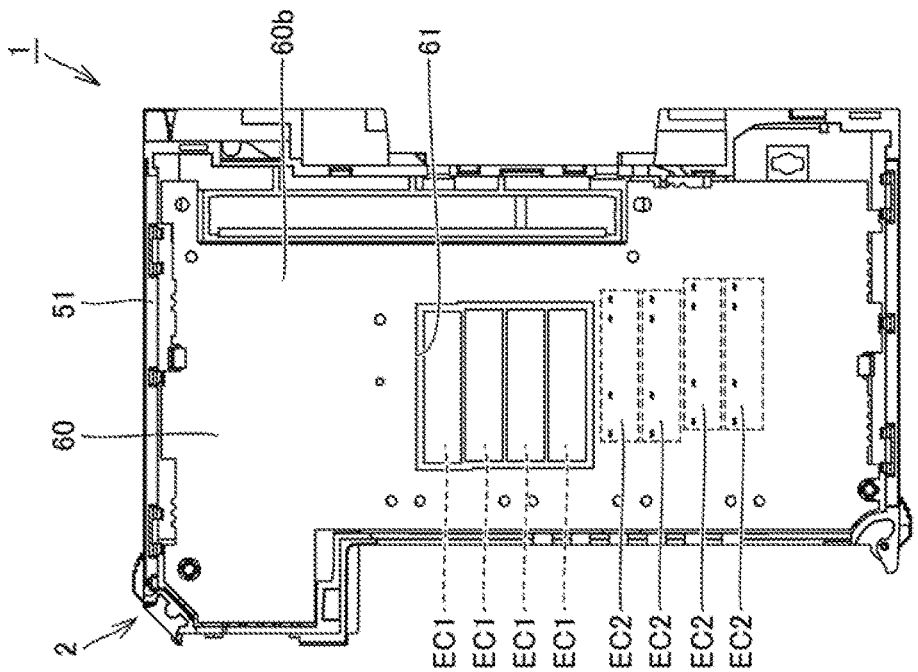
FIGS. 5A and 5B are schematic side views of an I/O unit, such as in FIG. 1, with a part of its cover being removed.
Figure 5B:
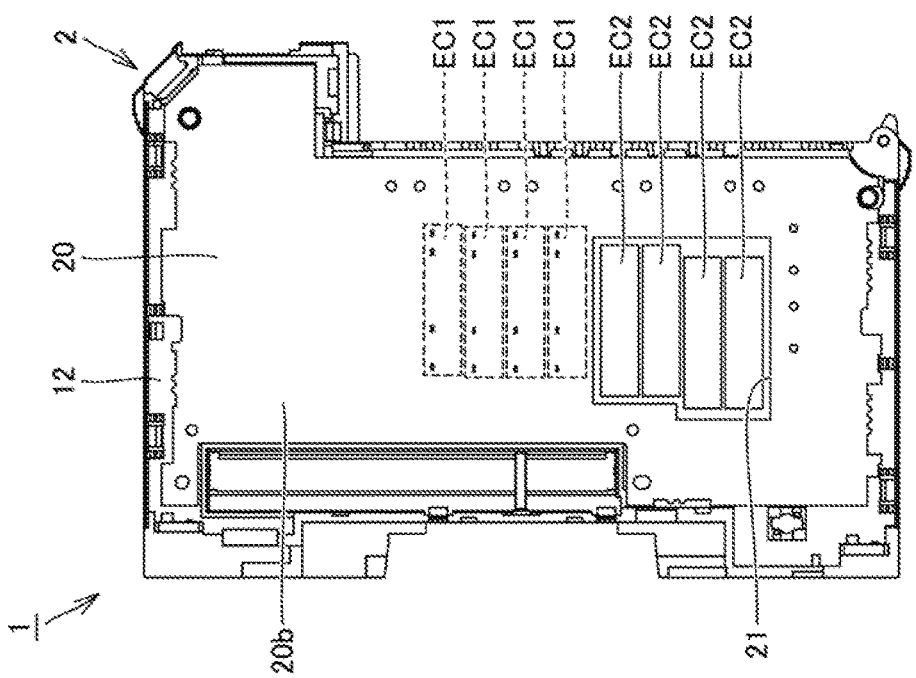

FIG. 1 is a perspective view of an I/O unit in one embodiment. FIG. 2 is a schematic exploded front perspective view of the I/O unit shown in FIG. 1 as viewed from right above. FIG. 3 is a schematic exploded perspective back view of the I/O unit shown in FIG. 1 as viewed from left below. FIG. 4 is a schematic sectional view of the I/O unit shown in FIG. 1 taken along line IV-IV in FIG. 1. FIGS. 5A and 5B are schematic side views of the I/O unit shown in FIG. 1 with a part of its cover being removed. FIG. 5A is a schematic left side view of the I/O unit without a left cover of a first casing, which is a left side surface of the I/O unit. FIG. 5B is a schematic right side view of the I/O unit without a right cover of a second casing, which is a right side of the I/O unit. Referring now to FIGS. 1 to 5B, the structure of an I/O unit 1 in one embodiment will be described. To simplify the drawings, some components are not shown in FIGS. 2 to 5B.

As shown in FIGS. 1 to 5B, the I/O unit 1 is a flat substantially cuboid having a width smaller than its height and its depth. The I/O unit 1 mainly includes a casing 2, a first circuit board 20, a second circuit board 60, various terminal parts including front terminal blocks 31 and 71 and a right surface side terminal block 72, and fixtures 40 and 80.

The casing 2 defines the front surface, the back surface, the top surface, the bottom surface, the left side surface, and the right side of the I/O unit 1. The casing 2 has the front terminal blocks 31 and 71 mounted on its front surface, and has the fixtures 40 and 80 mounted on its back surface.

The first circuit board 20 and the second circuit board 60 allow various electronic components to be mounted on them to function as circuits mounted on the I/O unit. The first circuit board 20 and the second circuit board 60 are contained in the casing 2.

The front terminal blocks 31 and 71 allow an external device to be electrically connected to the I/O unit 1. The front terminal blocks 31 and 71 each have multiple terminals. The front terminal blocks 31 and 71 each have multiple slots through which an external wire is inserted to allow connection between the I/O unit and the external device.

The right surface side terminal block 72 enables electrical connection between the I/O unit 1 and another I/O unit or a communication unit to be joined to the I/O unit 1. Although not shown in FIGS. 1 to 3, a left side surface terminal block is also arranged at a predetermined position on the left side surface of the I/O unit 1 to enable electrical connection between the I/O unit 1 and another I/O unit or a communication unit to be joined to the I/O unit 1.

The fixtures 40 and 80 are used to fix the I/O unit 1 to a DIN (Deutsche Industrie Normen, the German standard) rail in a removable manner. Each of the fixtures 40 and 80 includes a pulltab at its upper end, which protrudes upwardly from the back end of the top surface of the casing 2. The fixtures 40 and 80 are arranged on the back surface of the casing 2 and extend to an installation recess 2a, which can receive the DIN rail. Although not described in detail, the fixtures 40 and 80 can each hold the DIN rail that is placed in the installation recess 2a.

As shown in FIGS. 2 to 4, the casing 2 includes a box-shaped first casing 10 and a box-shaped second casing 50. The first casing 10 and the second casing 50 are arranged adjacent to each other in the width direction and are fitted together.

More specifically, the first casing 10 has, on each of an upper end and a lower end of its right side surfaces, a groove 15, which extends in the front-back direction, and the second casing 50 has, on each of an upper end and a lower end of its left side surface, a ridge 54, which extends in the front-back direction. The groove 15 in the first casing 10 and the ridge 54 in the second casing 50 are slidably engageable with each other. The groove 15 and the ridge 54 are engaged with each other to join the first casing 10 and the second casing 50 together.

Similarly, the first casing 10 has, on each of an upper end and a lower end of its left side surface, a ridge 14, which extends in the front-back direction, and the second casing 50 has, on each of an upper end and a lower end of its right side surface, a groove 55, which extends in the front-back direction. The ridge 14 and the groove 55 join the I/O unit 1 and another I/O unit or a communication unit together.

The first casing 10 is divided into two parts in the width direction. The first casing 10 includes a left cover 11, which mainly constitutes a left side surface of the first casing 10, and a right cover 12, which mainly constitutes a right side surface of the first casing 10. The left cover 11 of the first casing 10 serves as the left side surface of the I/O unit 1. The left cover 11 and the right cover 12 are arranged adjacent to each other in the width direction and are fitted together to form the box-shaped first casing 10.

More specifically, the left cover 11 has, at specific positions of its parts facing the right cover 12, multiple tabs 11a and multiple slots 11b, and the right cover 12 has, at specific positions of its parts facing the left cover 11, multiple tabs 12a and multiple slots 12b. The tabs 11a of the left cover 11 and the slots 12b of the right cover 12 are engageable with each other. The tabs 12a of the right cover 12 and the slots 11b of the left cover 11 are engageable with each other. The tabs 11a and the slots 12b are engaged with each other and the tabs 12a and the slots 11b are engaged with each other to join the left cover 11 and the right cover 12 together.

The second casing 50 is divided into two parts in the width direction. The second casing 50 includes a left cover 51, which mainly constitutes a left side surface of the second casing 50, and a right cover 52, which mainly constitutes a right side surface of the second casing 50. The right cover 52 of the second casing 50 serves as the right side surface of the I/O unit 1. The left cover 51 and the right cover 52 are arranged adjacent to each other in the width direction and are fitted together to form the box-shaped second casing 50.

More specifically, the left cover 51 has, at specific positions of its parts facing the right cover 52, multiple tabs 51a and multiple slots 51b, and the right cover 52 has, at specific positions of its parts facing the left cover 51, multiple tabs 52a and multiple slots 52b. The tabs 51a of the left cover 51 and the slots 52b of the right cover 52 are engageable with each other. The tabs 52a of the right cover 52 and the slots 51b of the left cover 51 are engageable with each other. The tabs 51a and the slots 52b are engaged with each other and the tabs 52a and the slots 51b are engaged with each other to join the left cover 51 and the right cover 52 together.

Each of the first circuit board 20 and the second circuit board 60 is a flat plate. The first circuit board 20 is contained and retained in the first casing 10. The second circuit board 60 is contained and retained in the second casing 50.

More specifically, the first circuit board 20 is fastened to the left cover 11 by engagement with a pin and a projection provided inside the left cover 11 of the first casing 10, and the second circuit board 60 is fastened to the left cover 51 of the second casing 50 by engagement with a pin and a projection provided inside the left cover 51 of the second casing 50.

The first circuit board 20 has a front surface and a back surface serving as a first main surface 20a and a second main surface 20b. The first casing 10 holds the first circuit board 20 to have its first main surface 20a and its second main surface 20b in the width direction.

The second circuit board 60 has a front surface and a back surface serving as a first main surface 60a and a second main surface 60b. The second casing 50 holds the second circuit board 60 to have its first main surface 60a and its second main surface 60b in the width direction.

The first main surface 20a of the first circuit board 20 faces the right cover 12 of the first casing 10. The second main surface 20b of the first circuit board 20 faces the left cover 11 of the first casing 10. The first main surface 60a of the second circuit board 60 faces the left cover 51 of the second casing 50. The second main surface 60b of the second circuit board 60 faces the right cover 52 of the second casing 50.

In this structure, the first circuit board 20 and the second circuit board 60 face each other at a distance L (refer to FIG. 4) to have their first main surfaces 20a and 60a facing each other, with the right cover 12 of the first casing 10 and the left cover 51 of the second casing 50 being sandwiched between them.

The first circuit board 20 has first electronic components EC1 mounted on a substantially middle part of its first main surface 20a. The first electronic components EC1 are taller than other electronic components (not shown). The first electronic components EC1 are relays or transformers. The first electronic components EC1 in one embodiment are four relays arranged side by side.

The second circuit board 60 has second electronic components EC2 mounted on a bottom part of its first main surface 60a. The second electronic components EC2 are taller than other electronic components (not shown). The second electronic components EC2 are relays or transformers. The second electronic components EC2 in one embodiment are four relays arranged side by side.

Each first electronic component EC1 has a mounting height H1 (refer to FIG. 4), which is from the first surface 20a of the first circuit board 20 toward the second circuit board 60. The mounting height H1 is greater than the distance L between the first circuit board 20 and the second circuit board 60. In this structure, with no measures taken, each first electronic component EC1 can come in contact with the right cover 12 of the first casing 10 and the left cover 51 of the second casing 50, and further with the second circuit board 60.

Each second electronic component EC2 has a mounting height H2 (refer to FIG. 4), which is from the first surface 60a of the second circuit board 60 toward the first circuit board 20. The mounting height H2 is also greater than the distance L between the first circuit board 20 and the second circuit board 60. In this structure, with no measures taken, each second electronic component EC2 can come in contact with the left cover 51 of the second casing 50 and the right cover 12 of the first casing 10, and further with the first circuit board 20.

As shown in FIGS. 2 to 4, in the I/O unit 1 in one embodiment, the right cover 12 of the first casing 10 has a first opening 13 at a position facing the first electronic components EC1 and the second electronic components EC2, and the left cover 51 of the second casing 50 has a second opening 53 at a position facing the first electronic components EC1 and the second electronic components EC2. The first electronic components EC1 and the second electronic components EC2 are placed through the first opening 13 and the second opening 53.

This prevents the first electronic components EC1 from coming in contact with the right cover 12 of the first casing 10 and the left cover 51 of the second casing 50, and also prevents the second electronic components EC2 from coming in contact with the left cover 51 of the second casing 50 and the right cover 12 of the first casing 10.

As shown in FIGS. 2 to 5B, in the I/O unit 1 in one embodiment, the second circuit board 60 has a first hollow portion 61, which is an opening at a position facing the first electronic components EC1, and further the first circuit board 20 has a second hollow portion 21, which is an opening at a position facing the second electronic components EC2. The first electronic components EC1 are placed through the first hollow portion 61. The second electronic components EC2 are placed through the second hollow portion 21.

This prevents the first electronic components EC1 from coming in contact with the second circuit board 60, and also prevents the second electronic components EC2 from coming in contact with the first circuit board 20.

As shown in FIG. 5B, the first hollow portion 61 in the second circuit board 60 is slightly larger than the total size of the first electronic components EC1 arranged side by side as viewed from above. This structure prevents the mounting surface area of the second circuit board 60 from becoming smaller.

As shown in FIG. 5A, the second hollow portion 21 in the first circuit board 20 is slightly larger than the total size of the second electronic components EC2 arranged side by side as viewed from above. This structure prevents the mounting surface area of the first circuit board 20 from becoming smaller.

This structure enables mounting of the first electronic components EC1 and the second electronic components EC2 on the I/O unit 1 in one embodiment when these components have mounting heights greater than the distance between the first circuit board 20 and the second circuit board 60 facing each other. This structure reduces the size of the I/O unit, unlike the structure including the first circuit board 20 and the second circuit board 60 arranged apart from each other with a distance greater than the mounting heights of the first electronic components EC1 and the second electronic components EC2.

The above structure prevents an electronic device including multiple circuit boards facing one another in a casing from being upsized for a relatively tall electronic component to be mounted on one of the circuit boards.

As described above, the I/O unit 1 in one embodiment is an electronic device that serves as a unit of a building block electronic device system, in which the I/O unit 1 can be joined to another I/O unit or to a communication unit in the width direction. The I/O unit 1 in one embodiment includes the first circuit board 20 contained and retained in the box-shaped first casing 10 and includes the second circuit board 60 contained and retained in the box-shaped second casing 50. The space containing the first circuit board 20 and the space containing the second circuit board 60 are partially separated in the casing 2.

In other words, the structure according to one embodiment is applicable to an electronic device that serves as a unit of a building block electronic device system, which can enhance the product lineup and can provide units with different specifications using fewer components.

Figure 6:
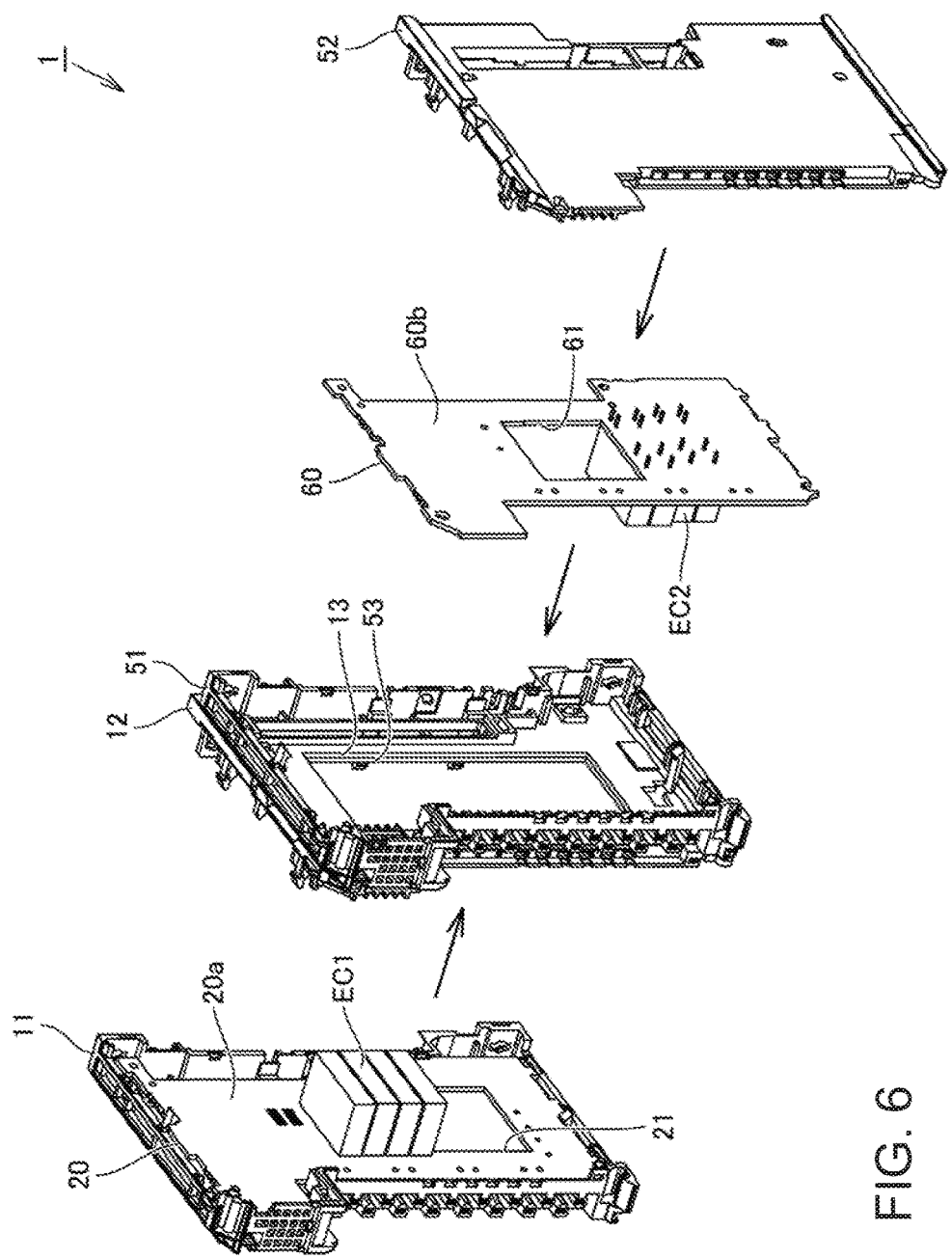
FIG. 6 is a schematic diagram illustrating the procedure for assembling an I/O unit, such as in FIG. 1.

FIG. 6 is a schematic diagram describing the procedure for assembling the I/O unit shown in FIG. 1. The procedure for assembling the I/O unit 1 in one embodiment will now be described with reference to FIG. 6. To simplify the drawing, some components are not shown in FIG. 6.

As shown in FIG. 6, assembling the I/O unit 1 in one embodiment first includes joining the left cover 51 of the second casing 50 to the right cover 12 of the first casing 10. More specifically, the left cover 51 is inserted from the front side along the right cover 12, and is slidably engaged with the right cover 12 to place the left cover 51 on the right of the right cover 12. This enables the first opening 13 of the right cover 12 to be aligned with the second opening 53 of the left cover 51.

The first circuit board 20 on which the first electronic components EC1 are mounted is then fitted with the left cover 11 of the first casing 10. The left cover 11 thus retains the first circuit board 20.

The left cover 11 retaining the first circuit board 20 is joined to the right cover 12 and the left cover 51 that are fitted together. More specifically, the first main surface 20a of the first circuit board 20 is placed to face the right cover 12, and the left cover 11 of the first casing 10 is pressed against the right cover 12 in the direction indicated by the arrow in the figure. The left cover 11 is thus fitted with the right cover 12, with the first electronic components EC1 being placed through the first opening 13 and the second opening 53.

The second circuit board 60 on which the second electronic components EC2 are mounted is attached to the left cover 51, which is fitted with the right cover 12, in the direction indicated by the arrow in the figure. The left cover 51 thus retains the second circuit board 60, with the second electronic components EC2 being placed through the first opening 13 and the second opening 53. As a result, the first electronic components EC1 have their ends placed through the first hollow portion 61 in the second circuit board 60, and the second electronic components EC2 have their ends placed through the second hollow portion 21 in the first circuit board 20.

The right cover 52 of the second casing 50 is joined to the left cover 51 retaining the second circuit board 60. More specifically, the right cover 52 is placed to face the second main surface 60b of the second circuit board 60 and is pressed against the second circuit board 60 in the direction indicated by the arrow in the figure. The right cover 52 is thus fitted with the right cover 51 of the second casing 50.

This completes the assembly process of the I/O unit 1. Positioning each component precisely enables smooth assembling of the I/O unit 1.

Although the second circuit board has an opening serving as the first hollow portion and the first circuit board has an opening serving as the second hollow portion in the embodiment described above, at least one of the first hollow portion and the second hollow portion may be a cutout.

Although the first circuit board has the second hollow portion in addition to the second circuit board having the first hollow portion in the embodiment described above, the first circuit board may not have the second hollow portion when no tall electronic component is to be mounted on the second circuit board.

Although the casing includes the box-shaped first casing and the box-shaped second casing adjacent to each other in the embodiment described above, the casing may have any other structure.

Although the first electronic components and the second electronic components are relays or transformers in the embodiment described above, the electronic components may be other electronic components, such as resistances, capacitors, coils, diodes, transistors, or integrated circuits.

The embodiments disclosed herein are only illustrative in all respects and should not be construed to be restrictive. The scope of the present invention is defined by the claims, and is construed as including any modification that comes within the meaning and range of equivalency of the claims.

REFERENCE SIGNS LIST

1 I/O unit
2 casing
2a installation recess
10 first casing
11 left cover
11a tab
11b slot
12 right cover
12a tab
12b slot
13 first opening
14 ridge
15 groove
20 first circuit board
20a first main surface
20b second main surface
21 second hollow portion
31 front terminal block
40 fixture
50 second casing
51 left cover
51a tab
51b slot
52 right cover
52a tab
52b slot
53 second opening
54 ridge
55 groove
60 second circuit board
60a first main surface
60b second main surface
61 first hollow portion
71 front terminal block
72 right surface side terminal board
80 fixture
EC1 first electronic component
EC2 second electronic component

The invention claimed is:

1. An electronic device, comprising:
a first circuit board and a second circuit board each having a front surface and a back surface as a first main surface and a second main surface, the first circuit board and the second circuit board being arranged at a distance from each other with the first main surfaces of the first and second circuit boards facing each other; and
a casing containing the first circuit board and the second circuit board, wherein the first main surface of the first circuit board allows mounting of a first electronic component having a mounting height from the first main surface of the first circuit board toward the second circuit board greater than the distance between the first circuit board and the second circuit board,
the second circuit board comprises a first hollow portion arranged as an opening or a cutout at a position facing the first electronic component,
the first hollow portion receives a part of the first electronic component the casing comprises a box-shaped first casing that accommodates the first circuit board such that the second circuit board is provided outside of the box-shaped first casing, and
the box-shaped first casing has a first opening through which the first electronic component is placed;
the casing comprises a box-shape second casing containing and retaining the side in a direction in which the first circuit board and the second circuit board face each other and are fitted together:
wherein the first casing has the first opening at a position facing the second casing,
the second casing has a second opening at a position facing the first casing, and
the first electronic component is placed through the first opening and the second opening.

2. The electronic device according to claim 1, wherein each of the first casing and the second casing includes a pair of covers that are arranged side by side in the facing direction and are fitted together.

3. The electronic device according to claim 1, wherein the first electronic component is a relay or a transformer.

4. The electronic device according to claim 1, wherein the second circuit board allows mounting of a second electronic component having a mounting height from the first main surface of the second circuit board toward the first circuit board greater than the distance between the first circuit board and the second circuit board,
the first circuit board comprises a second hollow portion arranged as an opening or a cutout at a position facing the second electronic component, and
the second hollow portion receives a part of the second electronic component.

5. The electronic device according to claim 4, wherein
the first electronic component and the second electronic component are placed through the first opening and the second opening.

6. The electronic device according to claim 5, wherein each of the first casing and the second casing includes a pair of covers that are arranged side by side in the facing direction and are fitted together.

7. The electronic device according to claim 4, wherein each of the first electronic component and the second electronic component is a relay or a transformer.

8. An electronic device, comprising:
a first circuit board and a second circuit board each having a front surface and a back surface as a first main surface and a second main surface, the first circuit board and the second circuit board being arranged at a distance from each other with the first main surfaces of the first and second circuit boards facing each other; and
a casing containing the first circuit board and the second circuit board, wherein
the first main surface the first circuit board allows mounting of a first electronic component having a mounting height from the first main surface of the first circuit board toward the second circuit board greater than the distance between the first circuit board and the second circuit board,
the second circuit board comprises a first hollow portion arranged as an opening or a cutout at a position facing the first electronic component, the first hollow portion receives a part of the first electronic component, the casing comprises a first casing containing and retaining the first circuit board, and a second casing containing and retaining the second circuit board, the first casing and the second casing are arranged side by side in a direction in which the first circuit board and the second circuit board face each other and are fitted together, the first casing and the second casing are box-shaped, the first casing has a first opening at a position facing the second casing, the second casing has a second opening at a position facing the first casing, and the first electronic component is placed through the first opening and the second opening.

* * * * *